United States Patent [19]

Kobayashi

[11] Patent Number: 4,763,108
[45] Date of Patent: Aug. 9, 1988

[54] DIGITAL-TO-ANALOG CONVERSION SYSTEM

[75] Inventor: Osamu Kobayashi, Yokohama, Japan

[73] Assignee: Fujitsu Limited, Kanagawa, Japan

[21] Appl. No.: 67,048

[22] Filed: Jun. 29, 1987

[30] Foreign Application Priority Data

Jun. 30, 1986 [JP] Japan ................ 61-151696

[51] Int. Cl.⁴ .............................. H03M 1/66
[52] U.S. Cl. ................ 340/347 DA; 340/347 DD
[58] Field of Search ............... 340/347 DA, 347 AD, 340/347 C, 347 NT, 347 DD

[56] References Cited

U.S. PATENT DOCUMENTS 3,251,052 5/1966 Hoffman ................ 340/347 C
4,529,965 7/1985 Lee ...................... 340/347 AD

OTHER PUBLICATIONS

U.S. Ser. No. 902,870, filed 9/2/86.
IEEE 1986, Custom Integrated Circuits Conference, pp. 366-369.
McCharles, "IEEE Transactions Circuits & Systems", vol. CAS-25, pp. 490-497, Jul. 1978.

Primary Examiner—Charles D. Miller
Attorney, Agent, or Firm—Armstrong, Nikaido, Marmelstein & Kubovcik

[57] ABSTRACT

A digital-to-analog conversion system including: a code conversion circuit for converting an input binary code to a three states code; the code conversion circuit designating each digit from one digit lower than a most significant digit to a least significant digit; when a designated digit and both lower and upper digits thereof are the same, a corresponding digit of the three states code is set to a first state, except for the above case, the designated digit is inverted, and when the upper digit of the designated digit is "0", the corresponding digit of the three states code is set to a second state, and when the digit lower than said designated digit is "1", the corresponding digit of the three states code is set to a third state, and a digital-to-analog conversion means connected to the code conversion and controlled by the three states code for outputting an analog value.

9 Claims, 10 Drawing Sheets

| DATA | | | | Vout |
|---|---|---|---|---|
| $D_0$ | $D_1$ | $D_2$ | $D_3$ | |
| 0 | 1 | 1 | 1 | $7/8 \cdot V_{ref}$ |
| 0 | 1 | 1 | 0 | $6/8 \cdot V_{ref}$ |
| 0 | 1 | 0 | 1 | $5/8 \cdot V_{ref}$ |
| 0 | 1 | 0 | 0 | $4/8 \cdot V_{ref}$ |
| 0 | 0 | 1 | 1 | $3/8 \cdot V_{ref}$ |
| 0 | 0 | 1 | 0 | $2/8 \cdot V_{ref}$ |
| 0 | 0 | 0 | 1 | $1/8 \cdot V_{ref}$ |
| 0 | 0 | 0 | 0 | 0 |
| 1 | 1 | 1 | 1 | $-1/8 \cdot V_{ref}$ |
| 1 | 1 | 1 | 0 | $-2/8 \cdot V_{ref}$ |
| 1 | 1 | 0 | 1 | $-3/8 \cdot V_{ref}$ |
| 1 | 1 | 0 | 0 | $-4/8 \cdot V_{ref}$ |
| 1 | 0 | 1 | 1 | $-5/8 \cdot V_{ref}$ |
| 1 | 0 | 1 | 0 | $-6/8 \cdot V_{ref}$ |
| 1 | 0 | 0 | 1 | $-7/8 \cdot V_{ref}$ |
| 1 | 0 | 0 | 0 | $-V_{ref}$ |

WEIGHTED: $-V_{ref}$, $1/2\, V_{ref}$, $1/4\, V_{ref}$, $1/8\, V_{ref}$ $$
\begin{array}{r}
\phantom{-)}\begin{array}{cccc} -V_{ref}+e_3 & \tfrac{1}{2}V_{ref}+e_2 & \tfrac{1}{4}V_{ref}+e_1 & \tfrac{1}{8}V_{ref}+e_0 \end{array}\\
\phantom{-)}\begin{array}{cccc} 0 & 0 & 0 & 0 \end{array}\\
-)\begin{array}{cccc} 1 & 1 & 1 & 1 \end{array}\\
\hline
\phantom{-)}\begin{array}{cccc} 0 & 0 & 0 & 1 \end{array}
\end{array}
$$

$\underbrace{\phantom{0\ 0\ 0\ 1}}_{\tfrac{1}{8}V_{ref}-(e_0+e_1+e_2+e_3)}$ $\begin{pmatrix} e_0 = e_1 = 0 \\ e_2, e_3 < 0 \end{pmatrix}$

| DATA | | | Vout |
|---|---|---|---|
| $D_0$ | $D_1$ | $D_2$ | |
| 1 | 1 | 1 | 7/8 · Vref |
| 1 | 1 | 0 | 6/8 · Vref |
| 1 | 0 | 1 | 5/8 · Vref |
| 1 | 0 | 0 | 4/8 · Vref |
| 0 | 1 | 1 | 3/8 · Vref |
| 0 | 1 | 0 | 2/8 · Vref |
| 0 | 0 | 1 | 1/8 · Vref |
| 0 | 0 | 0 | 0 |
| 0 | 0 | −1 | −1/8 · Vref |
| 0 | −1 | 0 | −2/8 · Vref |
| 0 | −1 | −1 | −3/8 · Vref |
| −1 | 0 | 0 | −4/8 · Vref |
| −1 | 0 | −1 | −5/8 · Vref |
| −1 | −1 | 0 | −6/8 · Vref |
| −1 | −1 | −1 | −7/8 · Vref |

⎧ 1/2 Vref  1/4 Vref  1/8 Vref ⎫
        WEIGHTED

Fig. 7

$$\begin{array}{r}
\frac{1}{2}V_{ref}+e_2 \quad \frac{1}{4}V_{ref}+e_1 \quad \frac{1}{8}V_{ref}+e_0 \\
1 \quad 0 \quad 0 \\
-) \quad 0 \quad 1 \quad 1 \\
\hline
0 \quad 0 \quad 1
\end{array}$$

$\frac{1}{8} V_{ref} + (e_2 - e_1 - e_0)$

Fig. 8

CODE VALUE "3" $\begin{cases} ① & 0 \quad 1 \quad 1 \\ ② & 1 \quad -1 \quad 1 \\ ③ & 1 \quad 0 \quad -1 \end{cases}$ ①
$$\begin{array}{r} 1 \quad 0 \quad 0 \\ -) \; 0 \quad 1 \quad 1 \\ \hline 0 \quad 0 \quad 1 \end{array}$$
ERROR $(e_2 - e_1 - e_0)$ ②
$$\begin{array}{r} 1 \quad 0 \quad 0 \\ -) \; 1 \quad -1 \quad 1 \\ \hline 0 \quad 0 \quad 1 \end{array}$$
$(e_1 - e_0)$ ③
$$\begin{array}{r} 1 \quad 0 \quad 0 \\ -) \; 1 \quad 0 \quad -1 \\ \hline 0 \quad 0 \quad 1 \end{array}$$
$(e_0)$

| PO | NO | $a_i$ |
|----|----|----|
| 1 | 0 | 1 |
| 0 | 0 | 0 |
| 0 | 1 | −1 |

Fig. 18

| CODE VALUE | 2'S COMPLEMENT BINARY CODE $d_i$ | | | | | THREE STATES BINARY CODE $a_i$ | | | |
|---|---|---|---|---|---|---|---|---|---|
| | $d_0$ | $d_1$ | $d_2$ | $d_3$ | $d_4$ | $a_1$ | $a_2$ | $a_3$ | $a_4$ |
| 15 | 0 | 1 | 1 | 1 | 1 | 1 | 1 | 1 | 1 |
| 14 | 0 | 1 | 1 | 1 | 0 | 1 | 1 | 1 | 0 |
| 13 | 0 | 1 | 1 | 0 | 1 | 1 | 1 | 1 | −1 |
| 12 | 0 | 1 | 1 | 0 | 0 | 1 | 1 | 0 | 0 |
| 11 | 0 | 1 | 0 | 1 | 1 | 1 | 1 | 0 | −1 |
| 10 | 0 | 1 | 0 | 1 | 0 | 1 | 1 | −1 | 0 |
| 9 | 0 | 1 | 0 | 0 | 1 | 1 | 0 | 1 | −1 |
| 8 | 0 | 1 | 0 | 0 | 0 | 1 | 0 | 0 | 0 |
| 7 | 0 | 0 | 1 | 1 | 1 | 1 | 0 | 0 | −1 |
| 6 | 0 | 0 | 1 | 1 | 0 | 1 | 0 | −1 | 0 |
| 5 | 0 | 0 | 1 | 0 | 1 | 1 | −1 | 1 | −1 |
| 4 | 0 | 0 | 1 | 0 | 0 | 1 | −1 | 0 | 0 |
| 3 | 0 | 0 | 0 | 1 | 1 | 0 | 1 | 0 | −1 |
| 2 | 0 | 0 | 0 | 1 | 0 | 0 | 1 | −1 | 0 |
| 1 | 0 | 0 | 0 | 0 | 1 | 0 | 0 | 1 | −1 |
| 0 | 0 | 0 | 0 | 0 | 0 | 0 | 0 | 0 | 0 |
| −1 | 1 | 1 | 1 | 1 | 1 | 0 | 0 | 0 | −1 |
| −2 | 1 | 1 | 1 | 1 | 0 | 0 | 0 | −1 | 0 |
| −3 | 1 | 1 | 1 | 0 | 1 | 0 | −1 | 1 | −1 |
| −4 | 1 | 1 | 1 | 0 | 0 | 0 | −1 | 0 | 0 |
| −5 | 1 | 1 | 0 | 1 | 1 | −1 | 1 | 0 | −1 |
| −6 | 1 | 1 | 0 | 1 | 0 | −1 | 1 | −1 | 0 |
| −7 | 1 | 1 | 0 | 0 | 1 | −1 | 0 | 1 | −1 |
| −8 | 1 | 1 | 0 | 0 | 0 | −1 | 0 | 0 | 0 |
| −9 | 1 | 0 | 1 | 1 | 1 | −1 | 0 | 0 | −1 |
| −10 | 1 | 0 | 1 | 1 | 0 | −1 | 0 | −1 | 0 |
| −11 | 1 | 0 | 1 | 0 | 1 | −1 | −1 | 1 | −1 |
| −12 | 1 | 0 | 1 | 0 | 0 | −1 | −1 | 0 | 0 |
| −13 | 1 | 0 | 0 | 1 | 1 | −1 | −1 | 0 | −1 |
| −14 | 1 | 0 | 0 | 1 | 0 | −1 | −1 | −1 | 0 |
| −15 | 1 | 0 | 0 | 0 | 1 | −1 | −1 | −1 | −1 |
| −16 | 1 | 0 | 0 | 0 | 0 | | | | |

+FS/2 marks rows 8 and 7; 0 marks rows 0 and −1; −FS/2 marks rows −8 and −9.

DIGITAL-TO-ANALOG CONVERSION SYSTEM

BACKGROUND OF THE INVENTION

1. Field of the Invention

The present invention relates to a digital-to-analog conversion system.

2. Description of the Related Art

Conversion of a digital code to an analog value is usually performed in the field of measurements. In general, to meet the necessary requirements, the conversion circuit must be capable of a high conversion speed, high resolution, satisfactory differential linearity, and low power consumption. Digital-to-analog conversion circuits employing, for example, an R-2R ladder type conversion or a $2^n$ weighting resistance type conversion, both of which use a resistance circuit network, are known. In these conventional types of conversion, a binary code, for example, a 2's complement binary code, is usually used to convert a digital code to an analog value, but in this case, problems arise because a so-called "differential non-linearity error" becomes very large in some digits during the conversion, as explained in detail hereinafter.

SUMMARY OF THE INVENTION

The object of the present invention is to provide a digital-to-analog conversion system enabling a high speed and precise conversion by employing an improved three states code method in which it is possible to reduce the differential non-linearity error.

In accordance with the present invention, there is provided a digital-to-analog conversion system including a code conversion circuit for converting an input binary code to a three states code; the code conversion circuit designating each digit from one digit lower than a most significant digit to a least significant digit; when a designated digit and both lower and upper digits thereof are the same value, a corresponding digit of the three states code is set to a first state, except for the above case, the designated digit is inverted, and when the upper digit of the designated digit is "0", the corresponding digit of the three states code is set to a second state, and when the digit lower than the designated digit is "1", the corresponding digit of the three states code is set to a third state, and a digital-to-analog conversion circuit connected to the code conversion and controlled by the three states code and outputting an analog value.

BRIEF DESCRIPTION OF THE DRAWINGS

In the drawings:

FIG. 7 shows differential non-linearity errors based on the three states code;

FIG. 8 shows the code conversion of the three states code according to the present invention;

DESCRIPTION OF THE PREFERRED EMBODIMENTS

Before describing the preferred embodiments, an explanation will be given of a conventional digital-to-analog conversion method, with reference to FIGS. 1 to 4.

Figures 1, 2:
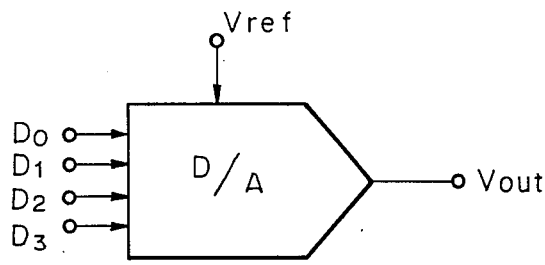
FIG. 1 is a schematic block diagram of a conventional digital-to-analog converter.
FIG. 2 shows one example of digital-to-analog conversion based on a conventional 2's complement binary code.

In FIG. 1, a digital-to-analog conversion circuit D/A is usually constituted by a R-2R ladder-type resistance circuit (not shown) or a $2^n$ weighting resistance-type circuit (not shown), and an operational amplifier (not shown). $V_{ref}$ is a reference voltage and is input to the resistance network, and $D_0$ to $D_3$ are digits of the digital code to be converted to the analog value and input to the resistance circuit through corresponding switches (not shown). Each digit is weighted by a predetermined weighed value, and the analog value $V_{out}$ can be obtained by calculating the sum of these weighted values multiplied by the reference voltage through the operational amplifier.

The list in FIG. 2 shows one example of digital-to-analog conversion of four digits $D_0$ to $D_3$, as expressed by the binary code, for example, the 2's complement binary code. For example, the digital code "1 0 1 0" is converted to the analog value "$-6/8 \cdot V_{ref}$" by the following calculations:

$$= -V_{ref} \times 1 + \frac{1}{2} \cdot V_{ref} \times 0 + \frac{1}{4} \cdot V_{ref} \times 1 + \frac{1}{8} \cdot V_{ref} \times 0$$

$$= -V_{ref} + \frac{1}{4} \cdot V_{ref} = -\frac{3}{4} \cdot V_{ref} = -\frac{6}{8} \cdot V_{ref}$$

A problem arises, however, in a major carry portion, in which almost all digits are inverted to opposite digits, for example, "1 1 1 1"→"0 0 0 0", and "0 0 1 1"→"0 1 0 0".

Figures 3, 4:
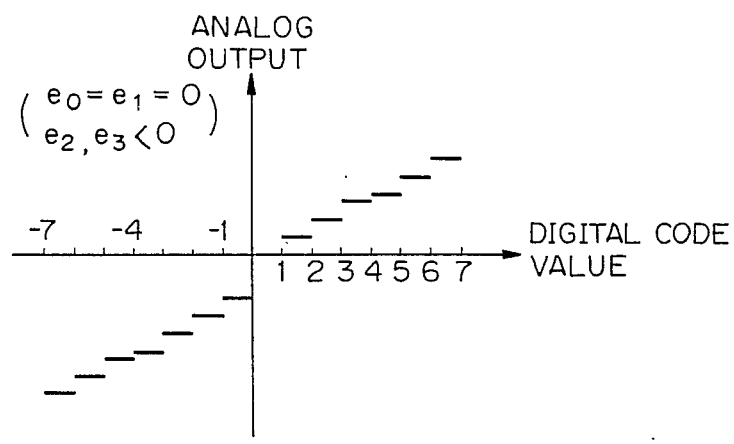
FIG. 3 shows differential non-linearity errors based on a conventional method.
FIG. 4 shows differential non-linearity errors based on a step graph.

In the major carry portion, the difference between each of the digits is only 1 LSB (least significant bit) (that is, $\frac{1}{8} \cdot V_{ref}$ as an analog value) as shown in FIG. 3. However, each digit contains a voltage error ($e_0$ to $e_3$) caused by an electrical dispersion of each resistance value constituting the resistance circuit, and thus the weighted analog value also contains these errors at every digit when converted. Therefore, the converted analog value becomes $\frac{1}{8}\cdot V_{ref}-(e_0+e_1\ e_2+e_3)$. The sum of these errors $(e_0+e_1+e_2+e_3)$ is called a "differential non-linearity error". As is obvious from FIG. 2, the major carry occurs in the two portions shown by dotted lines, and the differential non-linearity error has the largest value in these portions.

In this case, each step between each digit is moved away from 1 LSB, as shown in FIG. 4. In FIG. 4, the ordinate shows the analog value and the abscissa a digital code value. These steps indicates the data when $e_0=e_1=0$ and $e_2$, $e_3<0$ (absolute value $|e_2|$, $|e_3|>0$). As is obvious from these steps, when the digital code value "$-4$" is changed to "$-5$", the step of the analog output becomes small, and when the digital code value "0" is changed to "$-1$", the step of the analog output becomes large. Thus, it is obvious that the larger the deflection of the step, the larger the error in the differential linearity.

Figures 5, 6:
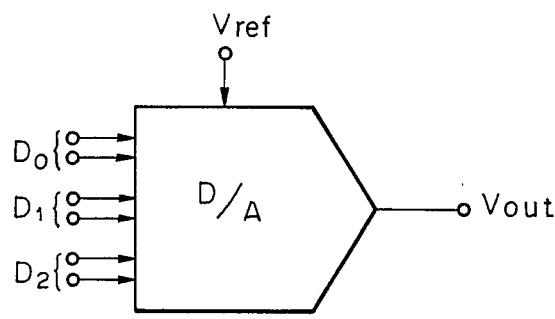
FIG. 5 is a schematic block diagram of a digital-to-analog conversion using the three states code.
FIG. 6 shows one example of digital-to-analog conversion based on the three states code.

The analog-to-digital converter has been disclosed in U.S. application No. 902,870 (filed on Sept. 2, 1986). In this converter, the three states code is used for analog-to-digital conversion as a cyclic A/D conversion. However, in this method, when the three states code as above is merely employed at a D/A converter shown in FIG. 5, the following problem occurs upon a conversion. That is, in this method, the major carry occurs in the two portions shown by dotted lines in FIG. 6. Therefore, the same problem arises in this three states code as in the 2's complement binary code, as shown in FIG. 7. That is, the converted analog value contains large differential non-linearity errors $(e_2-e_1-e_0)$, for the same reasons. In this case, the largest errors can be given by the sum of each absolute value $|e_0|+|e_1|+|e_2|$, as there are plus and minus values in each error. In FIG. 5, each of digits $D_0$ to $D_3$ can have three states; 1, 0, and $-1$. Therefore, two signal lines per each digit are necessary to handle the above three states.

A digital-to-analog conversion system according to the present invention will be explained in detail hereinafter.

In FIG. 8, when the three states code is employed, it is possible to express the analog value to three kinds of digital codes so that the difference of the differential non-linearity error is shown under various expressions ① to ③ of the digital code. In the three states code, for example, the digital code corresponding to the code value (decimal) "3" can be expressed in three forms, i.e., "0 1 1", "1 $-1$ 1", and "1 0 $-1$". That is, three kinds of digital codes "0 1 1"($2^2\times 0 +2^1\times 1+2^0\times 1=3$), "1 $-1$ 1"($2^2\times 1-2^1\times 1 +2^0\times 1=3$), and "1 0 $-1$"($2^2\times 1+2^1\times 0-2^0\times 1=3$) are equal to the code value "3". In the carry from the code value "3" to "4" (i.e., "1 0 0"), the sum of each error becomes "$e_2-e_1-e_0$" in the first form ①, "$e_1-e_0$" in the second form ②, and "$e_0$" in the third form ③. This is because all digits are inverted to the opposite digits in the first form ①, but only one digit is inverted to the opposite digit in the third form ③. In this case, the largest value is given by each absolute value, that is, $|e_2|+|e_1|+|e_0|$ in the first form ①, $|e_1|+|e_2|$ in the second form ②, and $|e_0|$ in the third form ③. Accordingly, it is possible to reduce the differential non-linearity error if the digital code of the third form is employed as the three states code.

The digital-to-analog conversion system according to the present invention uses the three states code to obtain a digital code having the above third form, as explained in detail hereinafter.

Figure 9:
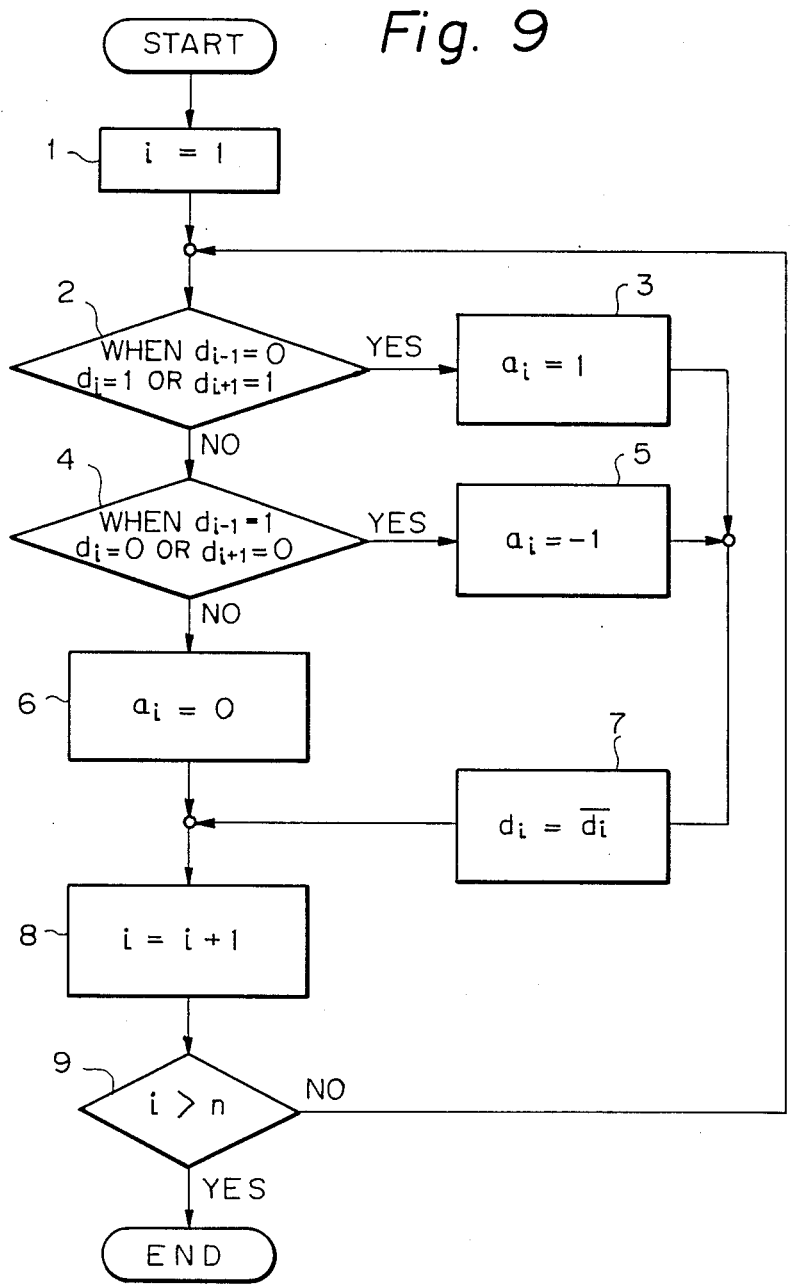
FIG. 9 is a flowchart of the process of a code conversion from the 2's complement binary code to the three states code according to the present invention.

The flowchart in FIG. 9 shows the code conversion process from the 2's complement binary code to the three states code according to the present invention. In the present invention, the digital code by the 2's complement binary code applied from an external stage is converted to another type of digital code by the three states code using a SRT division method by a divisor "1", or an equivalent method thereto. An SRT division method is a known method proposed by SWEENEY, ROBERTSON and TOCHER, but, in the present invention, the digital code is converted to the analog value through the another type digital code obtained by the SRT division by the divisor "1", or an equivalent method. That is, the code conversion is performed in such a way that each digit of the 2's complement binary code is divided by "1", and the resultant new digit is used in the three states binary code. In the flowchart, "$d_i$" represents an optional digit. Therefore, $d_0$ is an MSB (most significant bit), $d_1$ is a next lower digit, and $d_n$ is an LSB (least significant bit). In the present invention, the process is started from $i=1$, i.e., the next lower digit from the MSB (step 1) and is completed when $i>n$ (step 9).

In step 2, when $d_{i-1}=$"0", i.e., $d_0$ (MSB)$=$"0", it is determined whether or not the next lower digit $d_i$ or $d_{i+1}$ is "1". When $d_i$ or $d_{i+1}=$"1", the MSB of the three states code $a_i$ becomes "1" (step 3). This signifies that the analog value converted from the digital code is larger or smaller than "$\frac{1}{4}$" of the analog decision level. That is, when the result is "YES", this value is larger than "$\frac{1}{4}$", and when the result is "NO", this value is smaller than "$\frac{1}{4}$".

In step 4, when $d_{i-1}=$"1", i.e., $d_0$ (MSB)$=$"1", it is determined whether or not the next lower digit $d_i$ or $d_{i+1}$ is "0". When $d_i$ or $d_{i+1}=$"0", the MSB of the three states code $a_i$ becomes "$-1$" (step 5). This signifies that when the result is "YES", the analog value converted by the digital code is smaller than "$-\frac{1}{4}$", and when the result is "NO", this value is larger than "$-\frac{1}{4}$". These processes (steps 2 to 7) are based on the SRT division method by the divisor "1" or an equivalent method.

When $d_{i-1}=$"1", and $d_i$ and $d_{i+1}$ are not "0" in steps 2 and 4, the three states code $a_i$ becomes "0" at step 6. When $a_i=1$ and $a_i=-1$ is obtained at steps 3 and 5, the $d_i$ is the remainder of the SRT division by the divisor "1. Note, $\overline{d_i}$ is an inverted $d_i$. Therefore, in step 7, addition or subtraction is performed between $d_i$ and $\overline{d_i}$ to obtain the remainder value of the SRT division by the divisor "1" and a new three states code is obtained through the processes of steps 6 and 7.

When the process "$i=1$" is completed, the next process "$i=i+1$" is started by the same steps 2 to 7 (step 8). This process is repeated until "i" becomes larger than "n" (step 9). As explained above, "n" is the LSB of the three states code.

Figure 10:
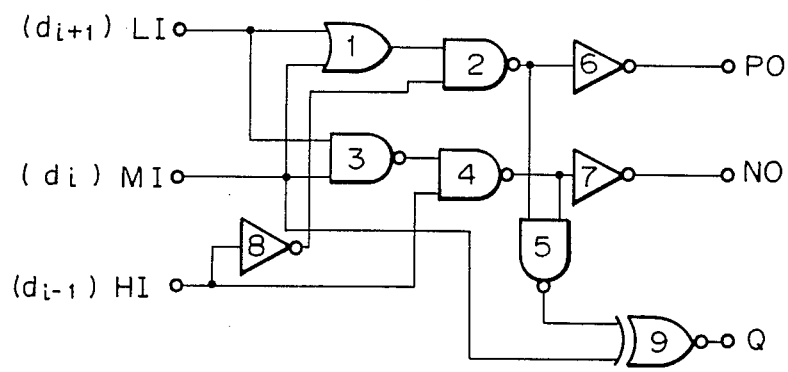
FIG. 10 is a detailed block diagram of a code conversion circuit used to carry out the process shown in FIG. 9.
Figures 12, 13:
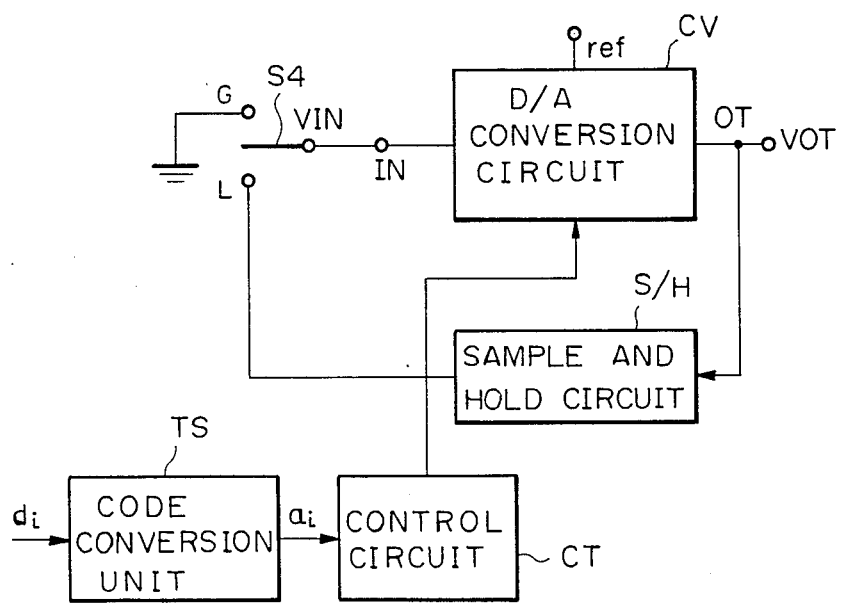
FIG. 12 shows the relationship between control commands and the three states code.
FIG. 13 is a schematic block diagram of a digital-to-analog conversion system according to the present invention.

FIG. 10 is a detailed block diagram of the circuit used for a code conversion from the 2's complement binary code to the three states code according to the present invention. In the figure, LI, MI, and HI represent input terminals, and digits $d_{i+1}$ $d_i$, and $d_{i-1}$ of the 2's complement binary code are input from these terminals LI, MI, and HI. PO, NO and Q represent output terminals. Two kinds of control commands expressing the three states code $a_i$ are output from these terminals based on a predetermined set of PO and NO as shown in FIG. 12. The output Q is used for subtraction between $d_i$ and $\overline{d_i}$, i.e., the NAND gate 5 detects "1" at any of PO or NO. The inverted $d_i$ by the exclusive OR gate 9 is output from the terminal Q, and this output is input to the HI terminal of the next stage. As explained above, this conversion circuit comprises an OR gate 1, four NAND gates 2 to 5, three inverters 6 to 8, and an exclusive OR gate 9. In this circuit, for example, when $d_{i+1}$ = "1", $d_i$ = "0", and $d_{i-1}$ = "0", an output of the OR gate 1 is "1" and the output of the NAND gate 2 is "0", thus, PO is "1", and the output of the NAND gate 3 is "1" and that of the NAND gate 4 is "1", and thus, NO is "0". As shown in FIG. 12, when PO is "1" and NO is "0", $a_i$ is "1".

Figure 11:
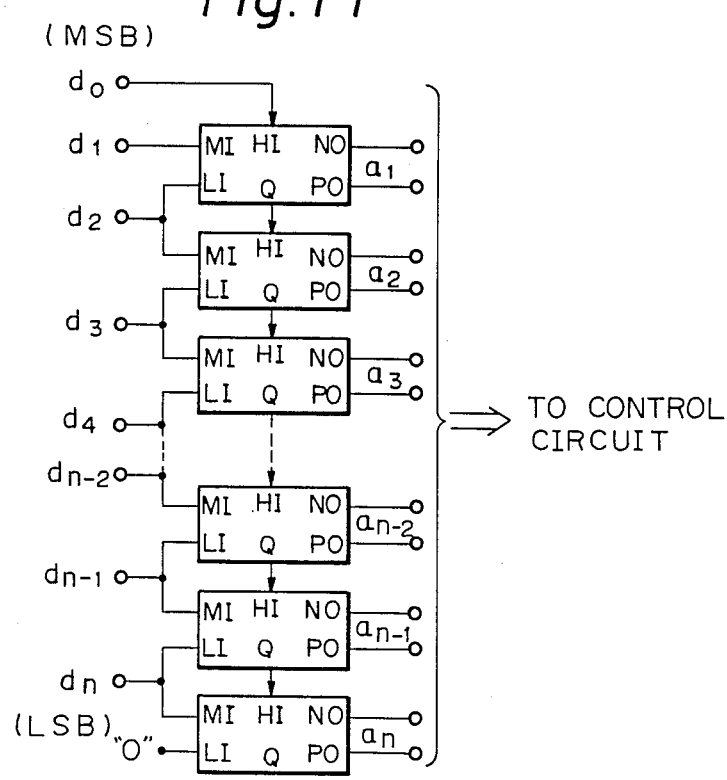
FIG. 11 is a block diagram showing the connection of the code conversion circuit shown in FIG. 10.

The block diagram in FIG. 11 shows the connection of a plurality of code conversion circuits shown in FIG. 10. Each of digits $d_0$ to $d_n$ denote the 2's complement binary code applied from an external stage by a user, and $a_l$ to $a_n$ denote three states codes inverted from digital codes.

The D/A conversion system according to the present invention shown in FIG. 13 is one example applied to the cyclic D/A converter. Of course, the present invention can be applied to other types of D/A converter. In FIG. 13, CV is a digital-to-analog conversion circuit; this circuit is shown in partial detail in FIGS. 15 and 16. S/H is a conventional sample and hold circuit, and CT is a control circuit constituted by a shift register and a timing generator; a partial detail diagram thereof being shown in FIG. 17. TS is a code conversion unit for converting the 2's complement binary code to the three states code; this circuit is shown in partial detail in FIGS. 10 and 11, as previously explained. S4 is a switch, and G and L are terminals for the switch S4. In this case, the terminal G is connected to the ground and the terminal L is connected to the sample and hold circuit S/H. The switch S4 operates only when the initial value is set to "0". That is, when the switch S4 is connected to the terminal G, the initial value is set to "0" and thereafter, the switch S4 is always connected to the terminal L.

Figure 14:
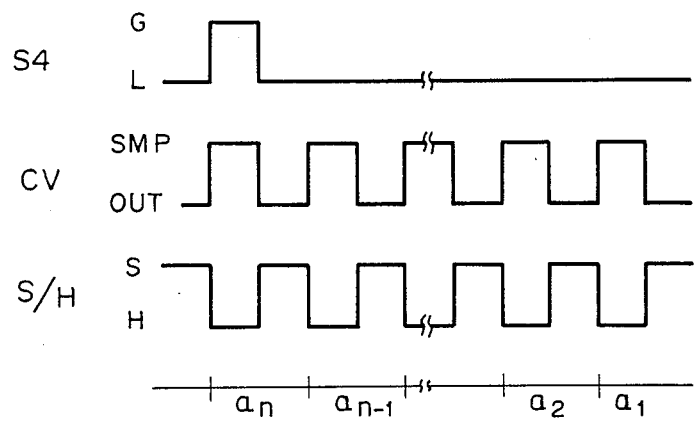
FIG. 14 is a timing chart of the basic operation of the system shown in FIG. 13.

A timing chart of the basic operation of the digital-to-analog conversion system is shown in FIG. 14. The D/A conversion circuit CV can have two states, i.e., a sampling state SMP and an outputting state OUT. The sample and hold circuit S/H also has two states, i.e., a sampling state S and a holding state H. $a_l$ to $a_n$ represent the three states code. In this case, the digit $a_l$ is the MSB and the digit $a_n$ is the LSB.

Figure 15:
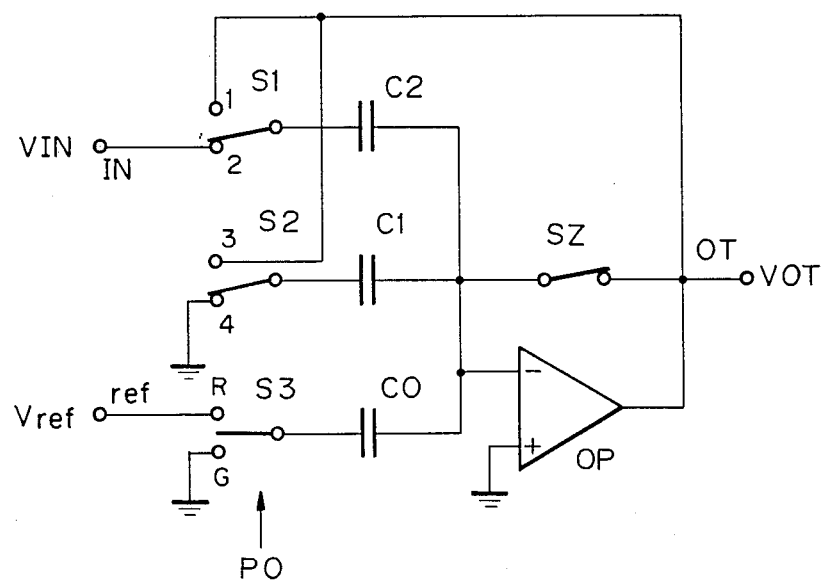
FIGS. 15 and 16 are detailed circuit diagrams of the D/A conversion circuit shown in FIG. 13.
Figure 16:
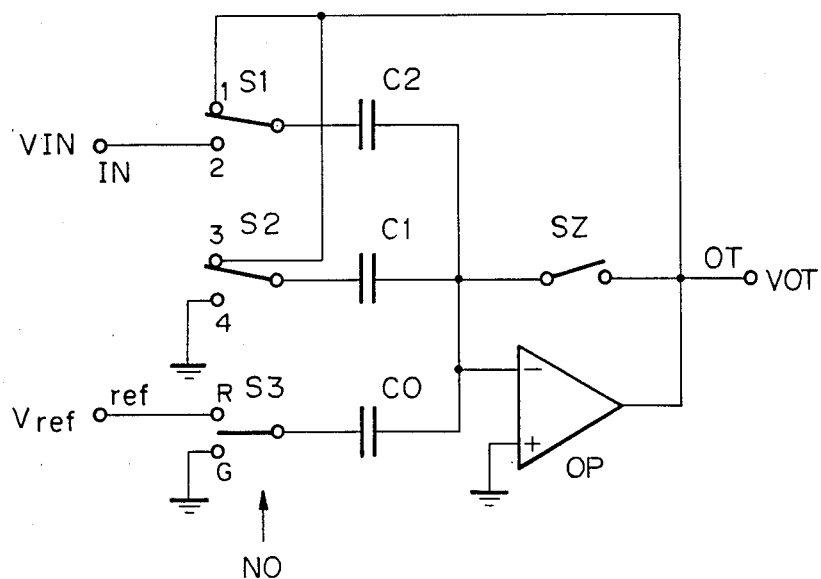

A partially detailed diagram of the D/A conversion circuit D/A is shown in FIGS. 15 and 16. FIG. 15 shows the sampling state and FIG. 16 shows the outputting state. In FIGS. 15 and 16, OP is an operational amplifier, C0 to C2 are capacitors each having an equivalent capacitance, SZ is a main switch, S1 is an input switch, S2 is a ground switch, S3 is a reference switch, IN is an input terminal, OUT is an output terminal, "ref" is an input terminal for a reference voltage $V_{ref}$, VIN is an input voltage, VOT is an output voltage, and 1 to 4 and R, G are connection terminals of switches.

In the sampling state as shown in FIG. 15, the switch SZ is ON, the switch S1 is connected to the terminal 2, and the switch S2 is connected to the terminal 4. In the outputting state as shown in FIG. 16, the switch SZ is OFF, the switch S1 is connected to the terminal 1, and the switch S2 is connected to the terminal 3. For sampling, the input voltage VIN is input from the input terminal IN, and for outputting, the output voltage VOT is output from the output terminal OT. In FIGS. 15 and 16, the switch S3 is controlled by the control commands OP and NO from the control circuit CT.

That is, the digits $a_i$ = 1, 0, −1 are used to control the switch S3. As shown in FIG. 12, the codes $a_i$ = 1, 0, −1 are determined by a set of PO and NO. As shown in the following table, in the sampling state shown in FIG. 15, when the digit $a_i$ = 1, the switch S3 is connected to the terminal R, and when the digit $a_i$ = 0 or $a_i$ = −1, the switch S3 is connected to the terminal G. In the outputting state shown in FIG. 16, when the digit $a_i$ = −1, the switch S3 is connected to the terminal R, and when the digit $a_i$ = 1 or $a_i$ = 0, the switch S3 is connected to the terminal G.

In FIG. 15, when the switch S3 is connected to the terminal R, the sampling of the input voltage VIN is performed with respect to the conversion $V_{ref}$ as follows.
switch SZ: ON
switch S1: to VIN
switch S2: to ground
switch S3: to $V_{ref}$
capacitor C0: charged by $V_{ref}$
capacitor C1: to ground
capacitor C2: charged by VIN When the switch S3 is connected to the terminal G, the sampling of the input voltage VIN is performed with respect to the conversion "0" as follows.
switch SZ: ON
switch S1: to VIN
switch S2: to ground
switch S3: to ground
capacitor C0: to ground
capacitor C1: to ground
capacitor C2: charged by VIN With respect to the conversion "$-V_{ref}$", the sampling of the input voltage VIN is based on the same connections as the above.

In FIG. 16, when the switch S3 is connected to the terminal G, the conversion of $V_{ref}$ is performed as follows.
switch SZ: OFF
switch S1: to terminal OT
switch S2: to terminal OT
switch S3: to ground
capacitor C0: to ground
capacitor C1: to terminal OT
capacitor C2: charged by $(VIN + V_{ref})/2$ With respect to the conversion of "0", the procedure is based on the same connections as above.

When the switch S3 is connected to the terminal R, the conversion of $-V_{ref}$ is performed as follows.
switch SZ: OFF
switch S1: to terminal OT
switch S2: to terminal OT
switch S3: to $V_{ref}$
capacitor C0: charged by $V_{ref}$
capacitor C1: to terminal OT
capacitor C2: charged by $(VIN - V_{ref})/2$ As can be understood from the above description, three kinds of output voltages $VIN/2$, $(VIN + V_{ref})/2$, and $(VIN - V_{ref})/2$ are obtained from the output terminal OT.

When $a_i$ = 1, 0, −1, the output voltage VOT is given as follows.

$$VOT = (VIN + a_i \cdot V_{ref})/2$$

For example, when the 2's complement binary code $a_i$ is "1 1 0 0 1 0 1 0" (= −54), the three states code $a_i$ becomes "−1 0 1 −1 1 −1 0" (=−54) by using the code conversion circuit shown in FIGS. 10 and 11. The digital-to-analog conversion is performed as follows.

Step 1; (LSB)

$$VOT = (0 + 0 \cdot V_{ref})/2 = 0 \qquad a_7$$

Step 2;

$$VOT = (0 + (-1) \cdot V_{ref})/2 = -V_{ref}/2 \qquad a_6$$

Step 3;

$$VOT = (-V_{ref}/2 + 1 \cdot V_{ref})/2 = V_{ref}/4 \qquad a_5$$

Step 4;

$$VOT = (V_{ref}/4 + (-1) \cdot V_{ref})/2 = -3/8 \cdot V_{ref} \qquad a_4$$

Step 5;

$$VOT = (-3/8 \cdot V_{ref} + 1 \cdot V_{ref})/2 = 5/16 \cdot V_{ref} \qquad a_3$$

Step 6;

$$VOT = (5/16 \cdot V_{ref} + 0 \cdot V_{ref})/2 = 5/32 \cdot V_{ref} \qquad a_2$$

Step 7; (MSB)

$$VOT = (5/32 \cdot V_{ref} + (-1) \cdot V_{ref})/2 = -27/64 \cdot V_{ref} \qquad a_1$$
$$= -54/128 \cdot V_{ref}$$

Figure 17:
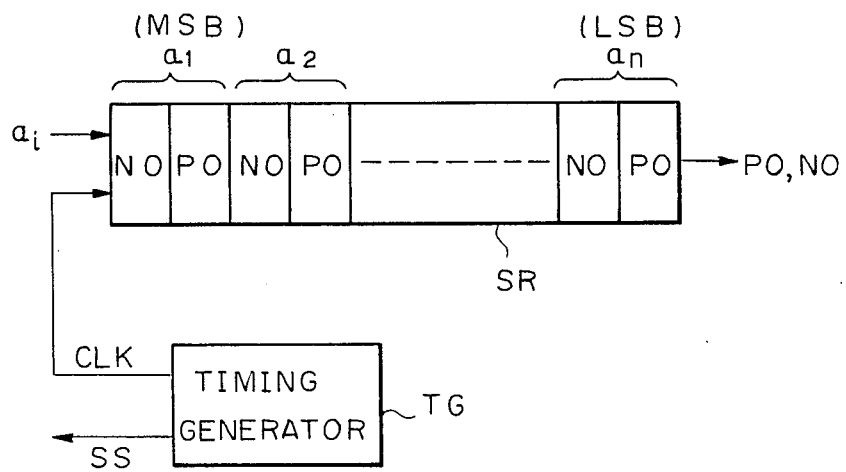
FIG. 17 is a detailed block diagram of the control circuit shown in FIG. 13; and, FIG. 18 shows one example of a code conversion from the 2's complement binary code to the three states code.

The shift register SR shown in FIG. 17 comprises a plurality of units corresponding to digits $a_l$ (MSB) to $a_n$ (LSB). Each of these units is divided into NO and PO portions and "1" or "0" is stored in the NO and PO according to the list shown in FIG. 12. For example, when $a_i = 1$, NO is "0" and PO is "1". Stored data is sequentially output from the digit $a_n$ (LSB) in response to a clock signal CLK. In this case, the control command PO is input to the switch S3 shown in FIG. 15 and the control command NO is input to the switch S3 shown in FIG. 16. That is, the control command PO is used for the sampling state and the control command NO is used for the outputting state. When the control commands PO and NO are "1", the terminal R is closed, and when the control commands PO and NO are "0", the terminal G is closed. These relationships are briefly shown in the following table.

TABLE

| $a_i$ | PO | Connection of S3 in Sampling State | NO | Connection of S3 in Outputting State | VOT Output |
|---|---|---|---|---|---|
| −1 | 0 | G | 1 | R | (VIN − $V_{ref}$)/2 |
| 0 | 0 | G | 0 | G | VIN/2 |
| 1 | 1 | R | 0 | G | (VIN + $V_{ref}$)/2 |

The timing generation TG generates a clock signal CLK for shifting the NO and PO in the shift register SR, and a switching signal SS for controlling the operations of the main switch SZ, the input switch S1, and the ground switch S2.

The list in FIG. 18 shows one example of a code conversion from the 2's complement binary code to the three states code according to the present invention. The major carry portions are shown by dotted lines in the 2's complement binary code, and the differential non-linearity error is large, as previously explained. That is, the major carry portions occur in "0", "+FS/2", and "−FS/2"(where; FS is full scale). Conventionally, the maximum errors occur in these portions, but these errors are eliminated in these portions in the present invention.

I claim:
1. A digital-to-analog conversion system comprising:
a code conversion means for converting an input binary code to a three states code; said code conversion means designating each digit from one digit lower than a most significant digit to a least significant digit; when a designated digit and both lower and upper digits thereof are the same value, a corresponding digit of said three states code is set to a first state, except for the above case, said designated digit is inverted, and when the upper digit of said designated digit is "0", said corresponding digit of said three states code is set to a second state, and when the digit lower than said designated digit is "1", said corresponding digit of said three states code is set to a third state, and
a digital-to-analog conversion means connected to said code conversion and controlled by said three states code and outputting an analog value.

2. A digital-to-analog conversion system as claimed in claim 1, wherein said code conversion means comprises logic circuit units constituted by the same number of a digit of said three states code; each of said logic circuit units having a first terminal for inputting said designated digit, a second terminal for inputting one digit upper than said designated digit, a third terminal for inputting one digit lower than said designated digit, a fourth terminal for ourputting said designated digit or an inversion of said designated digit, a fifth terminal for outputting one digit of said three states code, and a logic circuit; said logic circuit being constituted so as to output a first state signal to said fifth terminal and output said designated digit to said fourth terminal when values applied to said first, second and third terminals are the same, to output a second state signal to said fifth terminal and output said inverted designated digit to said fourth terminal when said value applied to said second terminal is "0" and another value applied to said first or third terminal is "1", and to output a third state signal to said fifth terminal and output said inverted designated digit when said value applied to said second terminal is "1" and another value applied to said first and second terminal is "0"; each of said logic circuit units being connected each other in such a way that a second terminal of a next stage logic circuit unit is connected to said fourth terminal of a previous stage logic circuit unit, and a first terminal of said next stage is connected to said third terminal of said previous stage, then a value "0" is input to the third terminal of the logic circuit unit corresponding to the most significant digit and each digit of said three states code is output from the fifth terminal of each logic circuit unit.

3. A digital-to-analog conversion system as claimed in claim 2, wherein said logic circuit unit comprises: an OR gate, one input being connected to said first terminal and the other input being connected to said third terminal; a first NAND gate (3), one input being connected to said first terminal and the other input being connected to said third terminal; a second NAND gate (2) receiving an output of said OR gate and an inverted signal from said second terminal; a third NAND gate (4), one input being connected to an output of said second NAND gate and the other input being connected to said third terminal; a fourth NAND gate (5), one input being connected to said second NAND gate and the other input being connected to said third NAND gate; and an exclusive NOR gate (9), one input being connected to said first terminal and the other being connected to an output of said fourth NAND gate; wherein outputs of said second and third NAND gates are operatively connected to said fifth terminal and an output fo said exclusive NOR gate is operatively connected to said fourth terminal.

4. A digital-to-analog conversion system as claimed in claim 1, wherein said digital-to-analog conversion means comprises a cyclic type digital-to-analog converter.

5. A digital-to-analog conversion system as claimed in claim 1, wherein each state of said three states code is given by a binary signal having two bits.

6. A digital-to-analog conversion system comprising:
   a code conversion means;
   a means for converting an input binary code to a three states code having an equivalent value obtained by an SRT division by a divisor "1"; and
   a digital-to-analog conversion means connected to said code conversion means and controlled by said three state code and outputting an analog value corresponding to said three states code.

7. A digital-to-analog conversion system as claimed in claim 6, wherein each digit of said three states code is given by a binary signal having two bits.

8. A method for converting a binary code to an analog value, comprising steps of:
   converting a binary code to a three states code; and
   converting said three states code to said analog value based on a sequential output,
   wherein said code conversion step further comprises the following steps performed from an upper digit to a lower digit of said binary code;
   (a) designating one digit of said binary code,
   (b) setting a corresponding digit of said three states code to a first state when an upper and lower digit value of a designated digit value are the same as the designated digit value,
   (c) setting a corresponding digit of said three states code to a second state when an upper digit of said designated digit is "0" and either said designated digit or one digit lower than said designated digit is "1", and inverting said designated digit,
   (d) setting a corresponding digit of said three states code to a third state when one upper digit of said designated digit is "1" and either said designated digit or one digit lower than said designated digit is "0", and inverting said designated digit, and
   (e) converting said designated digit to one digit lower than said designated digit.

9. A method for converting a binary code to an analog value as claimed in claim 8, wherein said code conversion step is performed by an SRT division method by a divisor "1" to a binary code.

* * * * *